United States Patent [19]

Morrison

[11] Patent Number: 4,677,388
[45] Date of Patent: Jun. 30, 1987

[54] SYNCHRONIZATION SLICER

[75] Inventor: Eric F. Morrison, Redwood City, Calif.

[73] Assignee: Ampex Corporation, Redwood City, Calif.

[21] Appl. No.: 788,356

[22] Filed: Oct. 17, 1985

[51] Int. Cl.[4] ............................................. H03K 5/153
[52] U.S. Cl. ..................... 328/150; 307/354; 307/358; 307/362; 328/147
[58] Field of Search ................. 307/354, 358, 362; 328/117, 150, 139, 147

[56] References Cited

U.S. PATENT DOCUMENTS

| | | | |
|---|---|---|---|
| 3,532,905 | 10/1970 | Zijta et al. | 307/358 |
| 3,676,783 | 7/1972 | Kinbara et al. | 307/358 |
| 3,763,436 | 10/1973 | Haw | 307/358 |
| 3,942,038 | 3/1976 | Hutch | 307/358 |
| 4,507,795 | 3/1985 | Wagner | 307/358 |

Primary Examiner—John Zazworsky
Attorney, Agent, or Firm—Ronald C. Fish; Elizabeth E. Strnad; Joel D. Talcott

[57] ABSTRACT

There is disclosed herein an apparatus and method for accurately ascertaining the time of occurrence of passage of the leading and trailing edges of an input pulse through the 50% amplitude level. The apparatus implements the transfer function 1 − cos(wt) where t is equal to the round trip delay through a delay line, and w is the angular velocity of each fourier component of the input signal. In one embodiment, a summing resistor and a delay line having a characteristic impedance equal to that of the resistor are used. The output of the delay line is coupled to one input of a comparator, and the other input is coupled to the junction between the summing resistor and the delay line. Another embodiment uses two matched delay lines, two factoring circuits, a summing circuit and a comparator to implement the same transfer function.

23 Claims, 11 Drawing Figures

SYNCHRONIZATION SLICER

The invention pertains to video processing circuits, and more particularly to level detectors used as sync slicers for television and other video signal processing systems.

In many color video applications it is necessary to know the time between the leading edge (earliest in time) of the horizontal synchronization (commonly, sync) pulse and a specified axis crossing of the color burst signal. This time is most often expressed in terms of horizontal sync to color subcarrier phase in units of degrees of the color burst signal. To obtain an accurate measurement of the sync to subcarrier phase requires the ability to accurately measure the 50% amplitude point on the leading edge of the horizontal sync pulse, the 50% amplitude point being defined as the measure of the time of occurrence of the edges of the sync pulse and the beginning of the horizontal line. This sync to subcarrier phase is defined in the NTSC and PAL specifications for television studio equipment signals, so accurate measurement of the phase is very important.

Another reason that the sync to subcarrier phase must be accurately known is many different video applications which deal with noisy video signals coming in from a communication link, or channel, such as a video tape recorder, strip out the original synchronizing signals from the received video signals such as the horizontal and vertical synchronizing signal, color burst and equalizing signals and substitute new, locally generated synchronization signals. This is done because often the original sync signals are usually distorted, noisy and otherwise incapable of being used for their intended purpose. This removal and substitution ensure the presence of proper synchronizing signals after the video signals have been transmitted through a communication link or after each of a number of successive reproductions of the video information using video tape recorders is made.

This removal and substitution technique is widely used in video signal processing systems of all sorts, such as in time base correctors for commercial video tape recorders. To correctly insert new synchronizing signals and burst signals, the sync to subcarrier phase in the original signal must be precisely known. If the same sync to subcarrier phase relationship is not maintained, the insertion of new synchronizing signals will be incorrect. Thus, the original sync to subcarrier phase must be known to enable accurate insertion of new, properly shaped synchronizing signals into the video signal received from a communication channel.

The present invention provides particular advantage when used in time base correctors. A time base corrector is a system that processes a video signal having time base errors to remove the errors and, thereby re-establish proper signal timing. In doing so, the video signal being corrected is retimed from its time base in the communication channel to the new, stable time base at the output of the time base corrector. This retiming usually is performed under the control of timing signals derived from the color burst synchronizing component of the video signal received from the communication channel and a stable reference color subcarrier signal. Because of the use of the color burst synchronizing component as a source of timing signals for the time base corrector, it is important to know the precise sync to burst phase of the received video signal so that addressing of the storage cells of the memories in the time base corrector employed to effect the retiming of the video signal can be properly sequenced and the new sync pulses can be reinserted in the output signal in the correct timed relationship.

Other applications where it is important to know the precise time of the 50% point of the horizontal sync pulse are in measuring pulse jitter and in setting color burst timing. Further, all television standards define pulse width from the 50% amplitude points of the leading and trailing edges. Thus, it is very important to be able to measure precisely the time of occurrence of the 50% point of synchronization pulses and of the horizontal sync pulse in particular.

In the prior art, the 50% point of the leading edge of horizontal sync was measured by taking a series of measurements of the peak level of the sync pulse over a portion of the duration of the peak level of the horizontal sync pulse and taking the average of these measurements. Another series of measurements of the level of a portion of the back porch of the horizontal blanking interval is taken and the average of the measurements is calculated. The two calculated averages are then added and halved to derive the mean, which is treated as the 50% amplitude point of the horizontal sync pulse.

This technique of determining the 50% amplitude point of horizontal sync pulses is subject to many errors. Such errors arise from imperfect frequency response of the circuitry in the synchronization and blanking channels leading to overshoot which destroys the flatness of portions of the measurement zone. Such errors also arise from the inability of the sample and hold circuits to track and correctly measure sudden changes in the D.C. levels being measured when the synchronization and blanking channels have imperfect D.C. coupling. There has arisen therefore, a need for an apparatus and method of measuring to a very high degree of accuracy, the time of occurrence of the 50% amplitude point of the leading edge of pulses, such as horizontal synchronizing pulses contained in composite television signals.

The present invention fills this need. In its broadest aspect, the invention is an apparatus and method for passing an input signal through a transforming means, in the form of a circuit having a transfer function equal to 1-cosine(wt) where w equals the angular velocity of the fourier components of the input signal and t equals a time equal to the time of the round trip delay through the delay line used to implement this transfer function. That is, the value of the transfer function and the attenuation for each individual fourier component can be determined by calculating 1-cosine(wt) at the frequency of that particular fourier component. After each fourier component is acted upon by the transforming means and the resultant individually attenuated fourier components are added together, the resultant transformed input signal results which has a specific pulse shape which is, for all practical purposes, independent of the degree of perfection of the frequency response of the sync signal processing circuits especially at the D.C. level. The resultant transformed version of the input sync signal has a pair of axis crossings at the times of passage of the leading and trailing edges of the sync pulse through the 50% amplitude level, with the axis crossings separated by a D.C. level defining the axis which is crossed as the leading and trailing edges of the input signal pass through their 50% amplitude levels. By comparing the transformed signal to a reference signal level, which is the D.C. level of the axis of the transformed output signal in the preferred embodiment, the times of passage of the sync pulse edges through the 50% point can be very accurately determined.

In a first embodiment, the present invention is implemented using an unterminated delay line having a delay equal to 0.5t where t=any constant that gives the waveform to be described below in FIG. 6B for a particular pulse duration at the input and a single summing resistor at the input of the delay line. The characteristic impedance of the delay line is equal to the impedance of the resistor. The impedance matching insures that the transfer function between the input and the node between the summing resistor and the delay line is cosine(wt). In operation, the input sync pulse is passed through the summing resistor and passes through the delay line. The delay line is unterminated in the sense that its output is coupled to the very high impedance non-inverting input of a differential amplifier. This high impedance does not match the impedance of the delay line and thus does not absorb any of the signal, so essentially all of the energy arriving at the input of the differential amplifier is reflected back toward the input through the delay line. The signal reflected back through the delay line is summed with the input signal in the summing resistor, both signals having experienced the same A.C. attenuation in the summing resistor but opposite in sign. The resultant signal at the node between the summing resistor and the delay line has two levels and a plateau or flat portion at the 50% level of the input sync pulse. The resultant sum is applied to the inverting input of the differential amplifier. The output of the differential amplifier, which is the difference of the two signals at its inputs, is a signal transformed from the input signal by the transfer function 1-cosine(wt). The output signal has axis crossings which occur at the times of occurrence of the 50% amplitude points of the incoming sync signal. This output signal from the differential amplifier is then compared by a comparator to a reference voltage which is set at the same level as the axis which is crossed by the output signal from the differential amplifier at the times of occurrence of the 50% amplitude points in the input pulse. The output of the comparator makes a transition at the time when the leading edge of the input pulse crosses through its 50% amplitude level. The output of the comparator makes another transition at the time when the trailing edge of the input pulse crosses through its 50% amplitude level.

In a second and preferred embodiment, the differential amplifier and comparator functions are performed in one comparator, since a comparator by its nature subtracts one of its inputs from the other. By comparing the delayed input pulse to the two level signal at the node between the summing resistor and the delay line (the "summing node"), there will be a transition on the input at the time the leading edge of the delayed input sync pulse rises to the level of the plateau or flat portion of the signal at the summing node. Another transition will occur when the trailing edge of the delayed sync pulse falls to the level of the plateau of the signal at the summing node. Since the plateau at the summing node is, by the very nature of the transfer function, at the 50% level, the transitions will occur at the time of occurrence of the 50% levels in the edges of the delayed sync pulse.

Because of the nature of the transformed waveform, there are certain ambiguous regions in the comparator output, i.e., regions where it is not known whether the comparator output will be a logic one or a logic zero. These ambiguous regions are eliminated by using a sync separator in combination with logic circuitry to generate "window" pulses to enable the output of the comparator during the expected times of the the transitions of interest for further processing. Any transitions during times outside the "windows" are prevented from appearing on the output of the comparator. The window waveforms are square wave pulses which have pulse durations which encompass the transitions mentioned above at the 50% levels of the leading and trailing edges of the input waveform. These window pulses are used to enable the outputs of the comparator only during the times when passage by the sync leading and trailing edges through the actual 50% points is expected and to disable the comparator outputs during the ambiguous regions of the transformed input waveform.

Simply stated, the invention is an apparatus and method for detecting the exact time of crossing of the leading and trailing edge of an input pulse through the 50% level which is independent of the degree of perfection of the frequency response; of the circuitry in the sync and blanking channel or other signal processing circuitry. All the embodiments of the invention depend for this quality on their implementation of the transfer function 1-cosine(wt). Because of the nature of this transfer function, signals are generated in response to a pulse input which when properly compared to each other or to a predetermined reference level (depending upon the embodiment) in a comparator cause transitions at the times of occurrence of the 50% levels on the leading and trailing edges of the input-pulse. No sample and hold circuits are used in the invention to measure the average D.C. level of the blanking level and the average D.C. level of the sync pulse such that the two averages may be summed and then halved to derive the 50% amplitude level of sync. Thus there is no danger in the structure of the invention that a sample and hold circuit which might not be able to track rapid changes in D.C. levels will cause an error in the measurement, for this reason the measurements made by the invention are virtually independent the degree of perfection in the D.C. coupling of the system. Basically, the fact that the invention makes no D.C. measurements of the sync and blanking levels as was done in the prior art renders the system independent of the inaccuracies caused by overshoot described above.

A better understanding of the invention may be had by reference to the drawings included herewith of which there follows a description.

Figure 1:
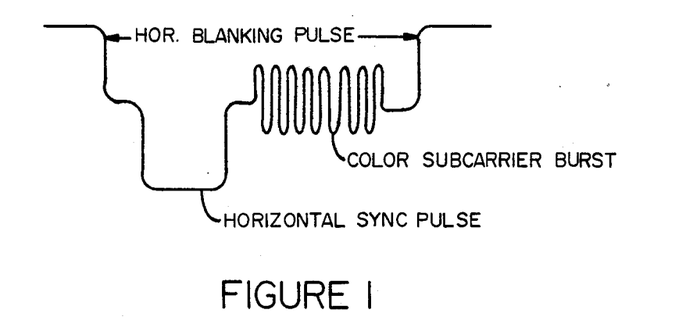
FIG. 1 is a drawing of a typical horizontal blanking region of a color television signal.

FIG. 1 illustrates for background purposes a typical composite color synchronizing signal comprised of a horizontal blanking pulse, a horizontal sync pulse and a color burst signal superimposed upon the back porch of the blanking pulse.

Figure 2:
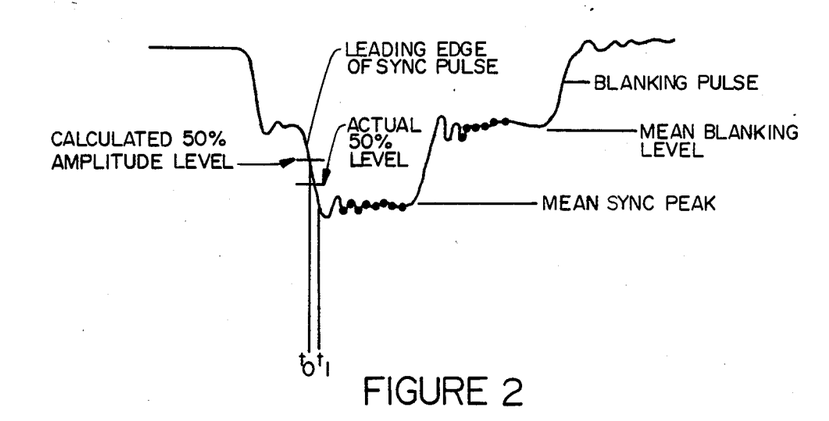
FIG. 2 is a drawing of a typical real horizontal composite sync and blanking pulse without burst after it has passed through a system with less than perfect frequency response such that the attenuation of some harmonics has caused the shape of the pulse to change somewhat, especially the "flat" portions at the blanking level and at the peak of the sync pulse.

FIG. 2 illustrates the prior art process for calculating the 50% amplitude level of a typical horizontal blanking period synchronizing signal where the horizontal sync pulse has noise and overshoot present. The signal shown in FIG. 2 represents the signal of FIG. 1 after it has been passed through a low pass filter to filter out the color burst. The series of measurements of the peak level of the horizontal sync pulse is illustrated as a series of points. The series of measurements of the peak blanking level, which is also the minimum sync pulse level, is illustrated as a series of points on the back porch of the blanking pulse. As noted above, the average of each series of measurements is calculated, the two averages are summed and then halved to determine the 50% level of the edges of the horizontal sync pulse. The calculated and actual 50% amplitude level are as marked in FIG. 2.

This technique of determining the 50% amplitude level of horizontal sync pulses, or any other type of synchronizing signal, is subject to many errors. First, as shown in FIG. 2, if there is any overshoot or noise in the composite signal, some of this unwanted energy can get into the zone of measurement and raise or lower some or all of the measurements, thereby creating errors in the calculated mean levels, which translates into error in the calculated 50% amplitude level. This is especially true for measurements taken at the peak level of the sync pulse, since the width of the sync pulse is small, which means the measurement zone is small and can overlap with overshoot regions near the leading edge of sync. Any deviation between the calculated 50% level and the actual 50% level becomes an error in the calculated time of occurrence of the start of the picture line and an error in the calculated sync to burst phase.

Such errors can become more pronounced, if the shape of the sync pulse becomes distorted as can happen in systems having sync and blanking channels with non-flat, i.e., imperfect, frequency responses. If the distortion alters the slope of the leading edge, a difference is introduced between the calculated and actual 50% sync levels, which translates into an error between the calculated start of the line and the actual start of the line.

Figure 3:
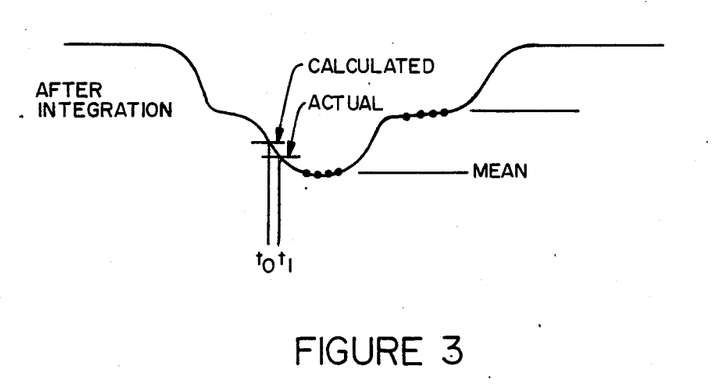
FIG. 3 is a drawing of the composite waveform of FIG. 2 after it has been passed through a low pass filter to eliminate noise and overshoot.

The effects of the noise and overshoot phenomena have in the prior art been compensated to some extent by passing the composite horizontal blanking signal through an integrator or low pass filter to shunt the high frequency noise and smooth out the waveform before measuring the sync pulse and blanking levels. The result is shown in FIG. 3. However, such integration also integrates the overshoot, which changes the peak level of the sync pulse and the blanking level. Such level changes introduce errors in the following measurements. Further, the low pass filter or integrator rounds off the sync pulse, flattening the slope of its leading edge. This aggravates the error, and causes the peak level of the sync pulse to be narrower, reducing the number of measurements which can be taken along the peak. The reduced number of measurements leads to less accuracy in determining the mean or 50% level of the syn pulse.

Such errors can cause several undesirable effects, of which some are described below. First an error in the calculated 50% level can cause errors in time base correction. To correct the time base of an incoming signal, modern time base correction usually digitizes the incoming video, stores digital words representing each sample level in memory addressed in accordance with a tape clock signal derived from the incoming signal, and reads the samples back out in accordance with signals from a reference clock which is running on the correct time base. However, to properly store the first digitized sample of each line, the time base corrector must know the precise time of the beginning of each incoming line. This time is defined as the time of occurrence of the 50% amplitude point of the incoming horizontal sync pulse preceding each line. Time base correctors use this time to generate the address signals for the first memory location assigned to each line and to generate the write signal which defines the time of the first pixel of the line and to write the digital sample for the first pixel of the line into the addressed memory location. If there is any error in determining the exact time of occurrence of the 50% amplitude level of the incoming sync pulse, then the first sample from the line may be stored in the wrong address and the error will ripple through the whole system.

Another error which can result from the improper determination of the time of the 50% level of the incoming sync pulse is momentary disturbances in the displayed picture. Such disturbances commonly occur when switching between sources of television signals and a 50% amplitude synchronization slicer such as discussed above with reference to the prior art acting on those signals makes an erroneous determination of the 50% amplitude point as a result of the switching between the sources. Such disturbances are undesirable or unacceptable for professional video systems.

Figure 4:
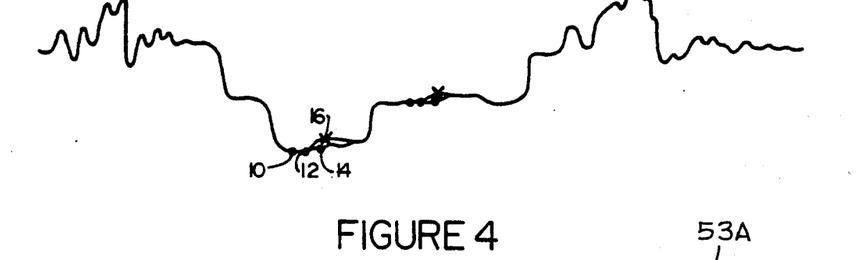
FIG. 4 is a drawing illustrating the problem of imperfect D.C. coupling and the errors caused thereby because of the time constant of the sample and hold circuit used to sample the D.C. levels.

To obtain accurate measurement of the 50% point of the sync pulse in the manner of the prior art requires a substantially perfect low frequency response to D.C. or zero frequency, since the D.C. components of the horizontal blanking interval are of utmost interest. If imperfect D.C. coupling leads to inadvertent shifts in the D.C. levels, then another errors is introduced. The effects of imperfect D.C. coupling are shown in FIG. 4. Common sources of such imperfect D.C. coupling and the resulting error as well known to those skilled in the art. The error which can be introduced by a sudden shift in a D.C. level results from the inability of the storage capacitors in sample and hold circuits used to sample the D.C. level to change voltage fast enough to track the sudden change in D.C. level. The sample and hold capacitors usually are part of circuits which have time constants which are such that a rapid shift in D.C. level cannot be accurately sampled. For illustration refer to FIG. 4. There, D.C. level sample points 10 and 12 illustrate points which correctly indicate the D.C.

levels at those points in time. Sample point 14, illustrates a perceived D.C. level which is erroneous compared to the actual D.C. level at that time which is shown at 16. Because of the long time constant, the capacitor of the sample and hold circuit being used to make these D.C. level measurements cannot charge to the level of the point 16 during the acquisition time, but instead only charges up the level of point 14 by the time the sample period ends. This introduces an error in one of the measurements used in calculating the average D.C. level.

Thus, measurement of the time of occurrence of the 50% amplitude point on the leading edge of the sync pulse in accordance with the prior art suffers from many inherent disadvantages which degrade its accuracy and render it unacceptable for use in high quality, commercial video equipment used by television broadcasters.

Figure 5:
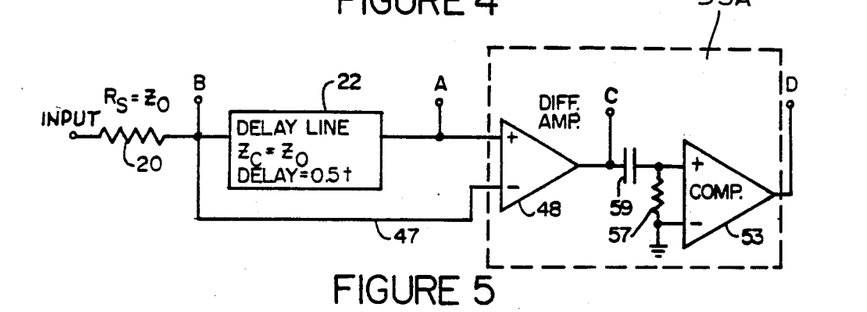
FIG. 5 is a block diagram of one embodiment of the invention.
Figure 6:
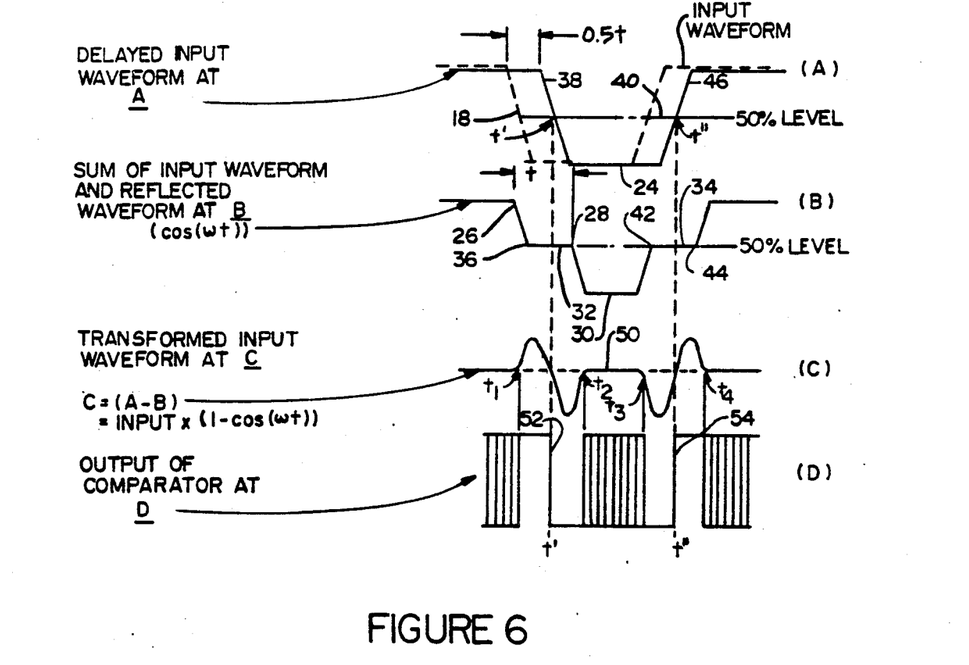
FIG. 6 is a timing diagram indicating timing relationships between various signals in FIG. 5.

Referring to FIGS. 5 and 6, there is shown a block diagram of an illustrative embodiment of the invention and the resultant waveforms at specific nodes in the circuit. The phantom waveform 18 in FIG. 6A is the input waveform which is applied to the input terminal on the extreme left of FIG. 5. This input waveform passes through a summing resistor 20 having a resistance which matches the characteristic impedance $Z_0$ of a delay line 22.

The input waveform next passes through the delay line 22 and is delayed by a delay factor of 0.5t which is the characteristic delay of the delay line. The delay factor t can be any number; between zero and positive infinity, but for horizontal sync pulses having a predetermined pulse width, t is selected according to a criteria defined below. The waveform 24 in FIG. 6A is the waveform which appears at the node A 0.5t seconds after the introduction of the input waveform at the input node.

The delay line 22 is unterminated because its output, i.e., the end farthest from the input end, is coupled to the input of a differential amplifier having an almost infinite input impedance. This prevents any D.C. current flow though the delay line, but does not prevent A.C. current flow since the delay line is comprised of reactive elements including capacitors coupling the signals passing through the inductive elements to ground. Because the termination impedance does not match the characteristic impedance of the delay line, substantially all the energy of the waveform 24 is reflected back toward the input. Another delay of 0.5t is imposed on this reflected waveform as it passes back through the delay line 22 toward the input, so the reflected waveform arrives at the node B a time t after the input waveform is introduced. The resultant voltage waveform at the node B is as shown in FIG. 6B. The time between the break points 26 and 28 is the round trip delay through the delay line 22. The reader can satisfy himself or herself that this is true by superimposing two waveforms of the shape of the waveform 24 but shifting one with respect to the other by the delay time t and then adding the two waveforms to derive a waveform of the shape of the waveform 30 in FIG. 6B. There is attenuation in the summing resistor 20 on both passes through the resistor 20, and those skilled in the art will appreciate that this attenuation is equal for each pass and opposite in polarity. The amplitude of the waveform 30 is approximately the same as the amplitude of the waveform 24 because the attenuation of the two components of the waveform 30 as they pass through the summing resistor 20 is the same.

The transfer function between the input node and the node B is cosine(wt) where t equals the delay factor of one round trip through the delay line 22 and w equals the angular frequency of the particular signal of interest. For an input signal like the waveform 18, the waveform 30 can be derived mathematically by breaking the input waveform down into its fourier components, substituting the angular frequency of each component into the expression cosine(wt) with t fixed as the time of one round trip through the delay line, solving for the value of the transfer function, and multiplying the amplitude of this particular fourier component by the value of the transfer function at that frequency. After this is done for all the fourier components, or the significant ones, the resultant components which represent individually attenuated sinusoids at the node B can be summed. The result will be a waveform having the shape of waveform 30 of FIG. 6B.

Note how the waveform 30 has a flat portion 32 which extends from the time of a break point 36 to the break point 28, a time which encompasses the time t' when the leading edge 38 of the waveform 24 passes through the 50% amplitude level 40. This flat portion 32 is located at the 50% amplitude level of the pulse 24 at the node A. The waveform 30 also has a flat portion 34 which extends from the time of a break point 42 to the time of a break point 44, a time which encompasses the time t" when the trailing edge 46 of the waveform 24 passes through the 50% level 40. The flat portion 34 is also located at the 50% amplitude level of the waveform 24 at then node A. The delay factor t of the delay line 22 should be selected such that these flat portions 32 and 34 do encompass the times t' and t" for a particular input pulse duration in a specific application.

The times t' and t" can be detected and signaled in two ways. The first is as shown in FIG. 5. The waveform at node B is coupled by a wire 47 to the inverting input of a differential amplifier 48. The node A is coupled to the non-inverting input of the differential amplifier 48. This differential amplifier subtracts the waveform 30 from the waveform 24 to create the waveform 50 as shown at FIG. 6C. The transfer function between the input node and the node C is 1-cosine(wt) where w and t are defined as above for the transfer function at the node B. This transfer function represents the transfer function of a delay line, i.e., unity, with the transfer function at the node B subtracted from it. The value of this transfer function for any particular frequency is calculated as above, and it operates on the fourier components of the input signal as described above. If one evaluates the transfer function at each frequency of a fourier component with t set equal to the round trip delay in delay line 22, and then multiplies the magnitude of each component by the magnitude of the transfer function at that frequency and sums all the results, the resultant waveform will be as shown in FIG. 6C. Again, the reader can become convinced of the truth of this fact by superimposing an upside down version of the waveform 30 on top of the waveform 24, and adding the two waveforms together to obtain the difference waveform 50.

Note how the waveform 50 has axis crossings at the times t' and t". These axis crossings can be detected to indicate the times of the crossings of the 50% level of the waveform 24. The point A is then used as a reference point for detection of the 50% point of the leading edge of sync and to measure the sync to burst phase.

The detection of these 50% crossing points is done in the first embodiment, i.e., the embodiment of FIG. 5, using a comparator 53 having its non-inverting input coupled to the node C through a D.C. blocking capacitor 59. In this first embodiment, both a differential amplifier and a comparator are used to detect the 50% points. In the preferred embodiment to be discussed below, the differential amplifier and the comparator are combined. In the embodiment of FIG. 5, the inverting input of the comparator 53 is coupled to ground to provide a stable reference level against which to compare the voltage waveform at the node C since the axis crossings at times t' and t" cross the zero voltage level in the embodiment shown in FIG. 5. That is, the waveform at node C has no D.C. component. The resistor 57 provides a load for the differential amplifier 48. The waveform at FIG. 6D represents the output waveform from the comparator at a node D. Note the comparator output makes unambiguous transitions 52 and 54 at times t' and t" as the waveform 50 passes through the zero axis at these times. Note also that the state of the comparator is ambiguous at times before t1, between times t2 and t3 and after time t4 when the waveform 50 is zero. Because the comparator has a high gain, any noise creating small differences between ground voltage and the voltage at node C will cause the comparator to change states unpredictably. In the preferred embodiment to be discussed below, precautions are taken to avoid the adverse effects should these unpredictable transitions occur. These precautions involve the use of gating circuits to enable the output of the comparator only at selected times when the transitions of interest are expected to occur.

The capacitor 59 is used to block any D.C. component in the output of the differential amplifier from reaching the comparator 53. Those skilled in the art will appreciate that this D.C. blockage is acceptable in the present scheme whereas it would not be acceptable in the prior art since the prior art scheme of sampling the D.C. levels of the composite horizontal blanking interval over a period of time at the top of the sync pulse and over a period of time on the back porch of the blanking waveform requires perfect D.C. coupling to maintain the flatness of these regions. Any non-flatness in the frequency response from approximately half the bandwidth of the system down to D.C. will cause the shape of the composite video to change and will inject error into the D.C. samples caused by waviness in the supposedly flat regions where the measurements are taken. Note the scheme of the invention is relatively independent of the frequency response of the system and independent of the degree of perfection of the D.C. coupling in the system. This independence of the degree of perfection of the frequency response of the system is one of the important features of the invention.

Note also that it is possible to combine the differential amplifier 48 and the comparator 53 into one unit. Since a comparator is a very high gain differential amplifier, it subtracts its two inputs by its very nature. That is, the function of the differential amplifier 48 is inherently performed by the comparator 53. If the differential amplifier were eliminated, as it is in the preferred embodiment of FIG. 7, the comparator would be comparing the waveform at the node A to the waveform at the node B of FIG. 5. Since the waveform at B has flat portions 32 and 34 which are at the 50% level of the waveform at the node A during the time the waveform at A has its leading edge 38 and its trailing edge 46 passing through the 50% amplitude level, the comparator output will change states precisely at the times the leading edge and trailing edge pass through the 50% amplitude level. These transitions in the comparator output can then be used to indicate the precise times of passage of the input pulse edges through the 50% amplitude levels.

Figure 7:
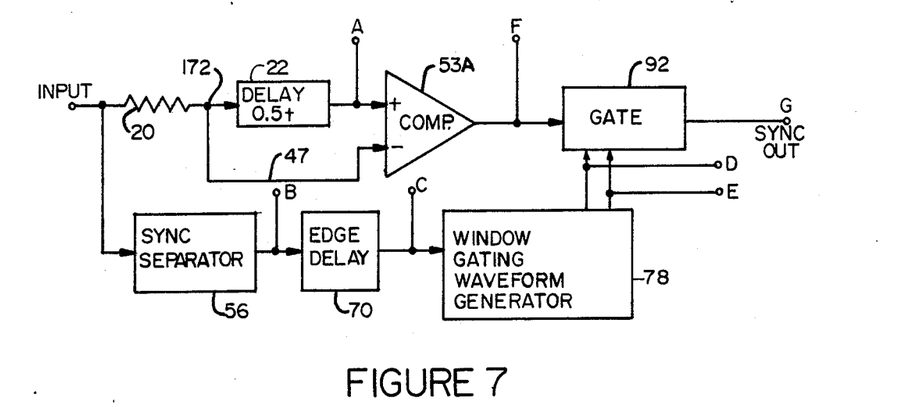
FIG. 7 is a block diagram of the preferred embodiment of the invention.
Figure 8:
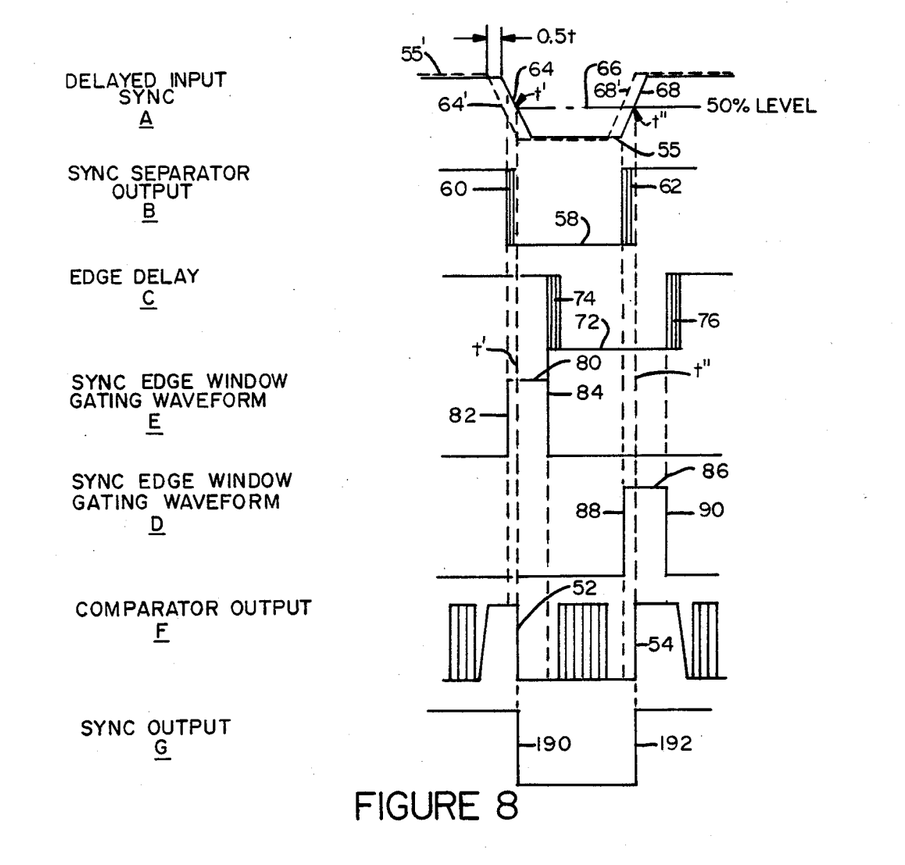
FIG. 8 is a timing diagram of various timing relationships between the signals present in the embodiment of FIG. 7.

Referring to FIG. 7, there is shown a block diagram of the preferred embodiment of the invention. FIG. 8 shows the waveforms at various nodes in the circuit marked with corresponding letters. The letters in FIGS. 7 and 8 do not correspond to the letters in FIG. 5. The input sync waveform 55' is applied at the node marked input, and it passes through the resistor 20 which serves the same purpose as the correspondingly numbered resistor illustrated in FIG. 5. The input sync waveform 55' then passes through a delay line 22 which has the same characteristics and serves the same purpose as the delay line 22 in FIG. 5. The waveform 55 then arrives at the non-inverting input of a comparator 53A delayed in time by 0.5t from the waveform 55' which was applied at the input.

The output of the delay line 22 is coupled to the non-inverting input of the comparator 53A which has its inverting input coupled to the input node of the delay line by the line 47. The combination of the delay line and comparator function in the same manner as the components 22, 48, 59, 57 and 53 of the embodiment described above with reference to FIG. 5. The input is also coupled to the input of a sync separator 56. The sync separator circuit inverts any noise peaks which exceed the peak sync level and generates the sync pulse 58 using a relatively inexpensive and simple sync slicer. This waveform 58 is generated from the non-delayed input waveform 55' as it existed at the input before passing through the delay line 22. Any circuit which can generate the waveform 58 will suffice for purposes of practicing the invention.

The waveform 58 has a transition 60 which can occur at any time which is earlier in time than the time t' when the leading edge of sync 64 passes through the 50% amplitude level 66. The waveform 58 also has a transition 62 which can occur at any time which is earlier than the time t" when the trailing edge of sync passes through the 50% level 66. Neither transition should occur so early as to encompass a portion of a period of ambiguity in the logical state of the output of the comparator 53A. The transition 60 can be generated by use of a sync slicer 56 which compares the incoming sync waveform 55' to a reference level which level will be reached by the leading edge 64' before the leading edge 64 of the delayed input sync waveform 55 passes through the 50% amplitude level 66. That is, the reference level for generating the transition 60 should be somewhere between the 50% level 66 in FIG. 8A and the D.C. level at the earliest point on the leading edge transition 64' in FIG. 8A, i.e., the juncture between the most positive flat part of the waveform 55' and the negative going leading edge 64' of waveform 55'. Note that if the sync separator 56 generates the transition 60 at the approximate 50% level of the leading edge 64' of the input pulse 55', then the transition 60 will automatically occur before the 50% amplitude point of the leading edge 64 of the delayed input sync pulse at the node A. This is the desired result.

The transition 62 can be generated in either of two ways. The first way is through use of another comparator in the sync separator 56 which compares the incoming sync pulse 55' to a certain reference voltage. This reference voltage must be selected such the trailing edge 68' of the input pulse 55' will reach it before the trailing edge 68 of the of the delayed input pulse 55 reaches the 50% level 66 at t". That reference voltage can be selected to be anywhere between the most negative flat portion of the delayed sync pulse 55 and the 50% level 66. Note the effect if the reference level is selected to be the 50% level 66 of the undelayed input sync pulse 55'. The trailing edge 68' of the undelayed pulse 55' reaches its 50% level 66 before the delayed pulse 55 trailing edge 68 reaches its 50% level 66. This latter effect is used in the preferred embodiment to simplify the construction of the sync separator 56 to generate both the transitions 60 and 62 using only a single comparator. This is the second method of generating the transition 62 alluded to in the topic sentence of this paragraph.

Essentially this second method of generating the transition 62 is to use the same comparator in the sync slicer 56 which was used to generate the transition 60, and set the reference level at the 50% level 66. The leading edge 64' and the trailing edge 68' of the input pulse 55' both reach the 50% level 66 before the corresponding delayed leading edge 64 and delayed trailing edge 68 reach their 50% points. Therefore the transitions 60 and 62 can be generated at the proper times relative to the times t' and t" by having this single comparator in the sync separator 56 compare the input pulse 55' to its approximate 50% level. The output of this comparator will make the transitions 60 and 62 at the proper times in this manner. Any other circuit which will generate the transitions 60 and 62 will also suffice.

The edge delay circuit 70 serves to delay the transitions 60 and 62 in the waveform 58 by a predetermined amount of delay to be specified below and to generate a waveform 72 having transitions 74 and 76 which correspond to the transitions 60 and 62, respectively, but which are delayed in time by the predetermined delay. The amount of delay is not important except that it must be sufficient to encompass the times t' and t". That is, each of times t' and t" are bracketed by a window defined by the transitions 60 and 74 for t' and transitions 62 and 76 for the time t". These window edges are used to generate window pulses such as the window pulses 80 and 86 shown in FIGS. 8D and 8E. These window pulses are generated by a window gating waveform generator 78. The window pulse 80 shown at FIG. 8E brackets the time t', and has its leading edge 82 corresponding in time to the transition 60 and its trailing edge 84 corresponding in time to the transition 74. A window pulse 86 shown at FIG. 8D brackets the time t" and has its leading edge 88 corresponding in time to the transition 62 and its trailing edge 90 corresponding in time to the transition 76. The window pulses are used to enable the output of the comparator 53 during the periods when the desired transitions 52 and 54 in the comparator output signal are expected to occur. All transitions which occur at times outside the windows are prevented from appearing on the comparator output by the lack of an enabling pulse. Any circuit which can generate the windows 80 and 86 as described above will suffice for the edge delay circuit 70.

The output of the comparator 53A is shown at FIG. 8F. This output is derived as described above. The comparator output makes the downward transition 52 at the time t' and makes the upward transition 54 at the time t". The signal at node F is applied to a gate circuit 92 which also receives the window pulses 80 and 86. The gate circuit 92 passes the downward transition 52 during the window pulse 80 through to a latch (inside the gate circuit 92) which is reset from the one state to the zero state by the transition 52 at the time t'. The gate circuit 92 also passes the upward transition 54 through to the set input of the latch to set it to the one state at the time t". The output of the latch is the sync output shown at FIG. 8G. Note how the window pulses 80 and 86 enable the outputs of the comparator only during the expected times of occurence of the transitions on the output of the comparator which indicate the times of occurrence of the 50% amplitude points. Any transitions which occur outside these window times, are prevented from appearing on the output of the comparator.

Figure 9:
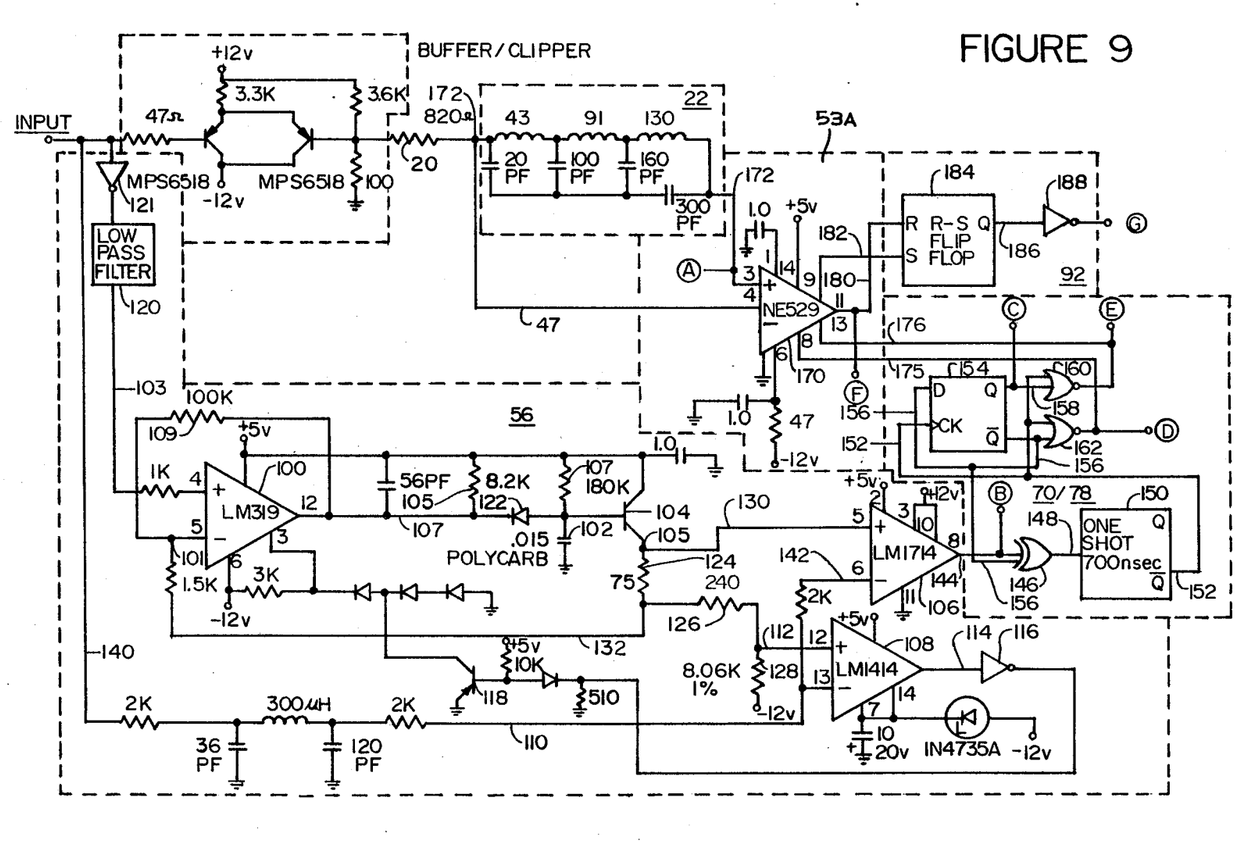
FIG. 9 is a detailed schematic of one implementation of the embodiment of FIG. 7.

Referring to FIG. 9 there is shown a schematic diagram for one implementation of the preferred embodiment shown in FIG. 7. Points in the circuit of FIG. 9 corresponding to the same points in FIG. 7 are similarly labeled. The circuit components comprising each of the blocks of FIG. 7 are outlined in phantom and labelled with like reference numerals. The sync separator 56 consists of a sample and hold circuit comprised of the comparator 100 and a sample capacitor 102 in conjunction with an emitter follower transistor 104, an A.C. feedback resistor 109, and the peak detector feedback resistor 124, as well as the line 132 and the 1.5K resistor coupled to the node 101, and a comparator 106. The sync separator 56 also includes a noise inverter comprised of a voltage divider network, i.e., resistors 124, 126 and 128, and a comparator 108. The noise inverter compares the video input on a line 110 to a reference voltage on a line 112 which reference voltage is of greater absolute magnitude than the largest excursion of the sync pulse. Since the sync pulse is always the largest amplitude excursion signal in the video signal absent noise, if anything exceeds this reference level, it is presumably noise and must be eliminated lest it be sensed by the sync separator as a false horizontal sync pulse.

These noise peaks are eliminated as follows. If a noise peak somewhere in the video signal or elsewhere exceeds the peak horizontal sync pulse peak value, the noise peak is sensed by the comparator 108 which makes a transition on its output line 114. This transition is inverted by the inverter 116 and drives the base of a transistor 118. This transistor has its collector coupled to the gain control input of the comparator 100, and reduces the gain thereof upon sensing of the noise peak by the comparator 108. Thus the peak detector does not see the noise peak and thus does not slice it as if it were a real horizontal sync pulse.

The sync separator functions to detect the negative peaks of the sync pulses using a peak detector. These peak levels are then used to establish a reference level against which the incoming video is compared and sliced to give the waveform shown at FIG. 8B. An inverting amplifier 121, such as any video amplifier with an odd number of stages, inverts the video from the input node A and applies it to the input of a low pass filter 120 to prepare it for sync separation. The low pass filter 120 filters out high frequency noise in the input video. This filtered, inverted video is then applied to the non-inverting input of an operational amplifier which has its output coupled to the sampling capacitor 102 through a diode 122. The base of the transistor 104 in the emitter follower senses the voltage on the capacitor 102 and presents this voltage through a unity gain transfer function at the node 105. The feedback impedance in the emitter line comprises the resistors 124, 126 and 128 coupling the emitter of the transistor 104 to a −12 volt supply. The voltage divider network insures that a portion of the voltage on the node 105 appears on the line 132 coupled as negative D.C. feedback to the inverting input 101 of the comparator 100. This negative D.C. feedback voltage is compared against the incoming video. The resistors 105 and 107 bias the diode 122 and capacitor 102 such that the voltage on the capacitor 102 always starts from a known voltage and the diode 122 is always reverse biased except when the output of the comparator 100 forward biases it and charges the capacitor to the level of the peak in the incoming video. This insures rapid acquisition time for the capacitor 102 to be charged to the voltage of the signal being sampled and insures a fast recovery time when the diode 122 again becomes reverse biased, i.e., the capacitor is driven again to the known starting voltage instead of being allowed to drift. The resistor 109 provides a measure of A.C. feedback to prevent the peak detector from having infinite gain. The operation of the peak detector, noise inverter and comparator of the sync separator 56 will be apparent to those skilled in the art of video design.

After the sync peaks have been detected and sampled (this sampling is for a different purpose than the sampling in the prior art and its accuracy is not critical to the accurate determination of the 50% point as long as it is accurate enough to correctly generate the window pulses 80 and 86 in FIG. 8), a reference voltage exists on the line 130 which is somewhat more negative than the 50% point of the inverted and positive going sync pulses. This reference voltage is applied to the non-inverting input of the comparator 106, and non-inverted video on a line 140/110 is applied to the inverting node 142 of the comparator 106. Thus the comparator output 144 makes a transition on both the leading edges and the trailing edges of the sync pulses in the video on the line 140/110. These transitions are shown at FIG. 8B as the transitions 60 and 62. The transition 60 occurs earlier than the 50% level 66 of the sync pulse 55 in FIG. 8A because the input sync waveform 55' is compared to a reference level which is reached by its leading edge 64' before the leading edge 64 of the delayed sync pulse 55 passes through the 50% level at the time t'. The transition 62 occurs before the time t" for the same reason in that the trailing edge 68' of the undelayed input sync waveform 55' is compared to a reference level which it passes through before the trailing edge 68 of the delayed sync pulse 55 passes through the 50% level 66 at the time t". Proper selection of the reference level on the line 130 compared to the delay of the delay line 22 allows one peak detector and one comparator to be used to make both transitions 60 and 62 in FIG. 8B.

The output of the comparator 106 on the line 144, i.e., the waveform of FIG. 8B, is applied to the input of the window gating waveform generator 78. This circuit serves to delay the edge transitions 60 and 62 for a fixed time, and to generate the edge transitions 74 and 76 in the waveform 72 of FIG. 8C. These transitions 74 and 76 are timed such that they occur after the times t' and t". The manner in which this is done will be understood by reference to FIG. 10 which is a timing diagram illustrating the operation of and timing relationships that exits in the window gating waveform generator 78.

FIG. 10A shows the waveform on line 144 which corresponds to the waveform 58 in FIG. 8B. This waveform 58 is applied to the input of an exclusive-or gate 146. The transition 60 causes the output of the exclusive-or gate 146, line 148, to make the transition 147. This transition triggers a 700 nanosecond pulse width one shot (monostable multivibrator) which causes its output, line 152, to make the transition 149. After 700 nanoseconds, the one shot spontaneously causes the output on the line 152 to make the transition 151. The transition 151 on the line 152 clocks a D flip flop 154 thereby causing its not Q output, line 156, to make the transition 153. The line 156 is coupled to both the input of the exclusive-or gate 146 and the D input of the D flip flop 154. The transition 153 shown in FIG. 10B causes the exclusive-or gate 146 to change states and make the transition 155. The same sequence of events occurs following the transition 62 on the line 144 to cause the transitions 157, 159, 161, 163, and 165, respectively.

Figure 10:
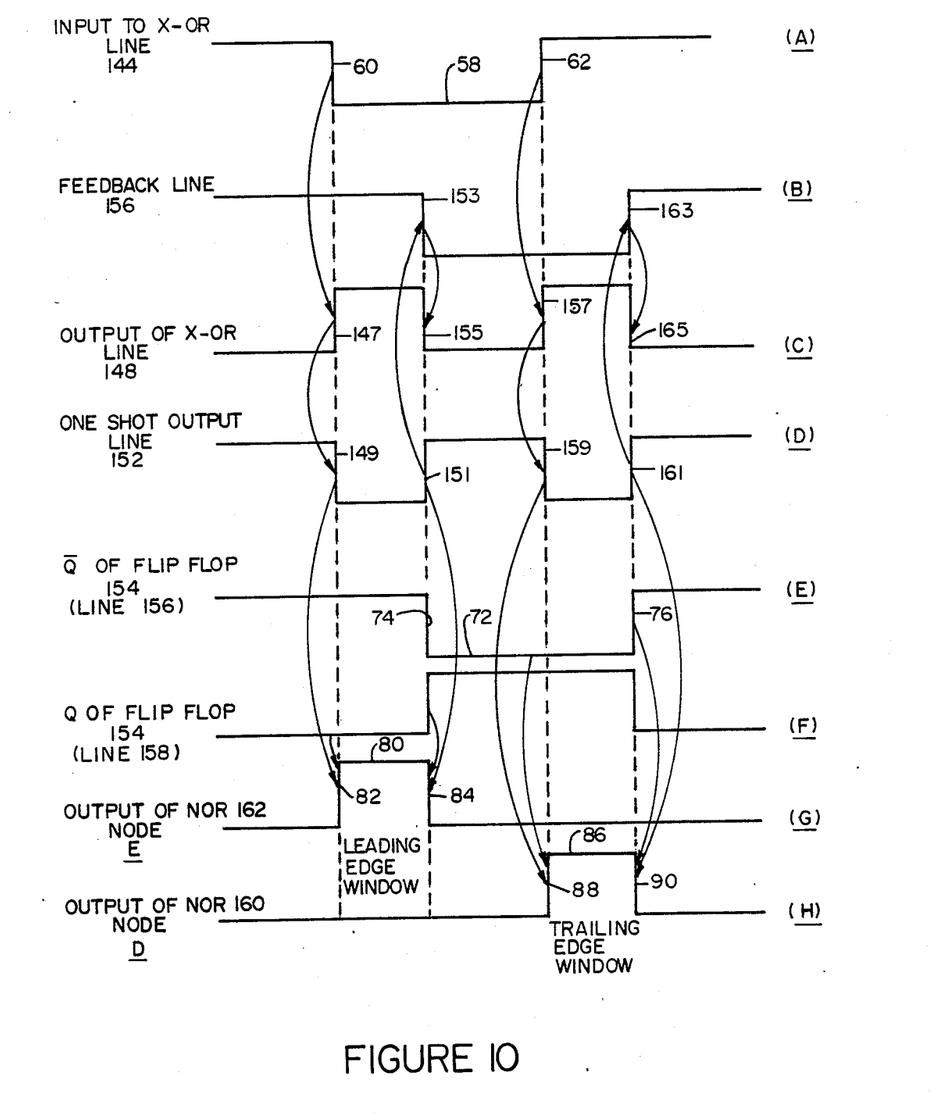
FIG. 10 is a timing diagram of various timing relationships between signals in the window gating waveform generator 78 in FIG. 7.

The waveform 72 of FIG. 10E corresponds to the waveform of FIG. 8C and is generated at the not Q output of the flip flop 154. Two NOR gates, 160 and 162 are used to generate the necessary window gating waveforms 80 and 86 at the nodes E and D respectively as shown in FIGS. 8E and 8D and FIGS. 10G and 10H. The node D waveform brackets the 50% point of the trailing edge 68 of the sync pulse 55 at node A as shown in FIGS. 8A and 8E, and is generated by the NOR gate 162 from the signals on the lines 156 and 152. Those skilled in the art will appreciate that NOR gates have their outputs at logic 0 for all input combinations except two logic zeros when the output becomes a logic 1. The effect of gate delays is ignored in FIGS. 8 and 10.

The window gating pulses 80 and 86 at the nodes D and E are applied to two enable inputs of a Signetics NE529 comparator 170 in the comparator 53A block. This comparator 170 has two outputs, one of which is the inverse of the other. Each can be enabled or disabled by signals at the enable inputs coupled to the nodes D and E. The non-inverting input of the comparator 170 is coupled to node A, the output of the delay line 22. The inverting input of the comparator 170 is coupled to a node 172 which is the interconnection point of the summing resistor 20 and the delay line 22.

The operation of the comparator 170 will be best understood by reference to FIGS. 6A and 6B. The two waveforms, 24 and 30, are the waveforms present at the comparator signal inputs, node A (line 172) and line 47, which corresponds to node B in the embodiment of FIG. 5. The comparator 170 makes a transition on its output when its inputs are equal. FIGS. 6A and 6B show that this occurs at the times t' and t". At t', the leading edge 38 of the waveform 24 is equal in amplitude to the flat portion 32 of the waveform 30. This is true because of the nature of the transfer function which transforms the input waveform to the waveform 30. Thus, when the waveform 24 on the line 172 in FIG. 9 is compared to the waveform 30 on the line 47, the comparator 170 changes the state of its output at the times t' and t", the times when the amplitudes of the waveforms at the comparator inputs are equal.

As noted in the discussion of FIG. 6 and FIG. 6D in particular, the comparator 48 (implemented by comparator 170 in FIG. 9) may also change states during times before t1, after t4 and between t2 and t3 as marked in FIG. 6C. These transitions would be caused by the very high gain of the comparator. To prevent these possible transitions from getting to the output, the window gating pulses 80 and 86 in FIG. 8E and 8D are applied on the lines 176 and 178 to the enabling inputs for the comparator 170. These window pulses only enable the comparator outputs during the times when the desired transitions 52 and 54 in FIG. 8F are expected to occur. Thus, any spurious transitions noted above are blocked from getting through to the circuitry connected to the output of the comparator 170.

The outputs of the comparator 170 are the lines 180 and 182. These two outputs make transitions in unison, but the signal on one of the outputs is the inverse of the signal on the other output. The two outputs are applied to the R and S inputs of an R-S flip flop 184 which is used to create the waveform at FIG. 8G. The transition 52 is taken from the proper output of the comparator 170 which makes a low to high transition at the time t' and is applied to the R input of the flip flop 184 to set it. The window pulse 80 must be applied to the proper enable input of the comparator 170 which enables this output. The transition 54 is taken from the proper output of the comparator 170 which makes a low to high transition at the time t" and is applied to the S input of the flip flop 184 to reset it. At the time t' then, the flip flop 184 will be set, its Q output on line 186 will go high, and an inverter 188 will invert this transition thereby creating a transition 190 at the G node as shown in FIG. 8G. At the time t", the flip flop 184 will be reset, the line 186 will go to logic 0, and the inverter 188 will cause a transition 192 at the node G thereby creating a new sync pulse as shown in FIG. 8G which has its transitions precisely at the 50% points of the input sync pulse.

The exact structure and operation of the sync separator 56, the edge delay circuit 70, the window gating waveform generator 78 and the gate 92 are not critical to the invention, as long as the above-stated criteria are met.

The accuracy of the measurement of the time of occurrence of the 50% point translates into the accuracy of measurement of the sync to burst phase. For a PAL television signal color subcarrier frequency of 4.43 megahertz, i.e., a period of 226 nanoseconds, and an accuracy in measurement of plus or minus one degree, the slicing time must be accurate to within 226/360=plus or minus 0.627 nanoseconds. With a horizontal sync waveform with a 300 nanosecond rise time, which is the worst case, the signal amplitude at the input to the comparator 170 must be 330/0.627=478 times the comparator input offset voltage. For a typical comparator with a 5 millivolt offset, the input signal level of $5 \times 10^{-3} \times 478 = 2.4$ volts. That is, the input sync waveform to the comparator 170 must rise to a 2.4 volt level in 300 nanoseconds to insure the accuracy if the comparator has an offset of 5 millivolts.

Figure 11:
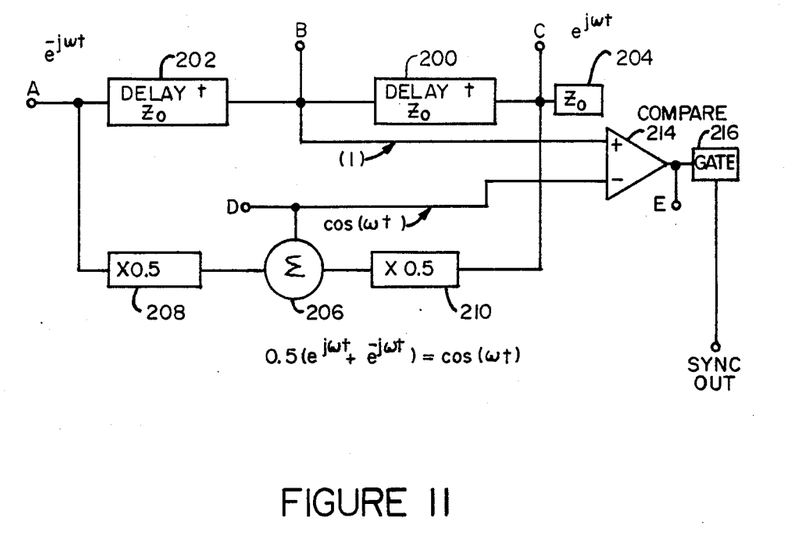
FIG. 11 is a block diagram of another embodiment of the invention using two delay lines.

FIG. 11 shows another embodiment of the invention which implements the 1-cos (wt) transfer function. This embodiment uses two delay lines, two factoring circuits, a summing circuit and a subtraction circuit. This embodiment can be used in either a digital environment or in an analog environment, i.e., the invention as embodied using two delay lines can be implemented using either digital or analog circuits to perform the functions mentioned above. In the analog embodiment using two delay lines, the delay lines, factoring circuits, and summing circuit must be matched so as to not attenuate one of the signals in one path to the summing circuit more than its counterpart on the other path.

In the analog version of the embodiment of FIG. 11, the input signal is introduced at the node A. This input sync waveform, which is like the waveform shown at FIG. 8A, propagates through two matched delay lines 200 and 202 which each impose a delay of t seconds and which each have a characteristic impedance of $z_0$. Each of the delay lines is terminated in its characteristic impedance 204 which absorbs the energy of the input waveform and prevents reflections back toward the input node A. The nodes A and C then have signal waveforms which are identical to the waveform at the input, except that with respect to a time $t_0$ at reference node B, the signal at the node A is earlier in time by a time t and the signal at the node C is later in time by a time t. These signals can be represented by a complex number with the signal at the node A represented by the complex number $e^{-jwt}$ and the signal at the node C represented by the complex number $e^{jwt}$. By Euler's identity, $e^{jwt} = \cos(wt) + j \sin(wt)$ and $e^{-jwt} = \cos(wt) - j \sin(wt)$. Each signal therefore has sinusoidally varying real and imaginary parts varying as the cosine and sine, respectively. Therefore each signal can be represented as a vector in the complex plane making the angle w times t with the real axis, where w is the angular frequency of the signal and t is time delay of the delay line. The opposite signs of the exponents indicate the signs of the delays of +t and −t relative to the node B. The signals at the nodes A and C thus are rotating phasors which are rotating in opposite directions in the imaginary plane and which having sinusoidal projections on the real axis.

If two sinusoids are added, the result is another sinusoid. That is what is done in the embodiment of FIG. 11. The signals at the nodes A and C are each passed through matching attenuators 208 and 210 which attenuate each signal by half. The attenuated signals are then summed in a summer 206 to result in a signal at node D which is cosine (wt). This result follows from Euler's identity which causes the imaginary sine components of the phasors to cancel out leaving only two 0.5 cosine (wt) terms which sum to cosine (wt). The attenuators and summer can be any known structure for analog attenuators and summers, and their exact structure is not critical to the invention as long as the attenuation of each signal is matched such that the result at node D is exactly cosine (wt). This is necessary to insure that the transfer function of the system, 1- cosine (wt) evaluates to exactly 0 at zero frequency. This can be understood from the following.

The transfer function from the node B to the node D is cosine (wt) for any signal at the input. This is true because any signal can be represented by a series of sinusoidal fourier components at different frequencies which, when summed, yield the shape of the particular waveform in question. Each sinusoidal fourier component can be represented in the exponential or phasor form as $e^{jwt}$ where w is the frequency of that particular component. Each fourier component is acted upon by the transfer function between the nodes B and D with the value of the transfer function established by setting w equal to the frequency of the particular fourier component. When all these components are summed, the result for an input pulse of the shape of FIG. 6A will be a waveform of the shape of FIG. 6B.

The signal at node D is then subtracted from, the signal at the node B in a comparator 214. The comparator 214 performs both the differential amplifier and comparator functions, as it has been previously described. Consequently, it transforms the input signal utilizing the transfer function 1-cos (wt) internally, and slices the transformed signal to obtain an output signal at node E. This output will have the shape of the signal at FIG. 6D. The output of the comparator 214 is then applied to a gating circuit 216 which performs the same function as the circuitry in FIG. 7 which generates the gating pulses 80 and 86 and uses them to selectively gate the output of the comparator 214 and which uses the transitions 52 and 54 in the comparator output on node E to generate the waveform shown at FIG. 8G.

It is possible to implement the embodiment of FIG. 11 digitally. Digital techniques avoid the need in analog circuitry to match the attenuation of the two signal components added by the summer 206 through the two separate paths to the summer from the node B. If the matching is not perfect in analog implementations of the embodiment illustrated in FIG. 11, the coefficient of cosine (wt) in the transfer function between nodes B and D is not exactly one, and the resulting transfer function 1-cosine (wt) between the nodes E and B would not be exactly zero at zero frequency or D.C. The D.C. response of the embodiment of FIG. 11 in its analog version must be substantially correct (exactly matched attenuation along each delay path to the summer) because any error in attenuation of the D.C. components will result in a shift of the levels of the flat portions 32 and 34 in the waveform 30 of FIG. 6B. This would result in an error in switching time for the transitions at node E like the transitions 52 and 54 in the comparator output shown at FIG. 6D. This would result in an error in signaling the times t' and t" of the attainment of the 50% level at the leading and trailing edges of the input sync pulse.

In a digital embodiment of FIG. 11 no reflections of the input synch pulse back through the delay lines occurs, and variations in attenuation along the two separate pathers to the summer 206 do not exist for digital signals. In a digital embodiment, the delay lines 200 and 202 are conveniently shift registers, the termination 204 is eliminated because there is no possibility of reflection of the output of a digital delay line back into the line, and the attenuators 208 and 210 are simple shifters to shift the binary numbers in the stream representing the incoming sync pulse, right by one place to implement a division by two. In implementations of the invention where speed is not a consideration, the summer 206 could be a programmed microprocessor using well known addition algorithms. Also, the comparator 214 could be implemented as a routine in a programmed microprocessor to subtract the numbers in the two incoming data streams and to compare the results and write an I/O byte when the result is zero. The I/O operation would write a number to a latch to set it at the time t' and to write another number to a latch to reset it at the time t" when equality is detected. In implementations of the invention where more speed is necessary than can be provided by a microprocessor, the summer and comparator functions described above are performed in logic gate networks the design of which are within the skill of an average digital logic designer. Those skilled in the art will appreciate that the above described functions could also be implemented in other well known ways.

It will be apparent to those skilled in the art that numerous modifications can be made to the embodiments described herein without departing from the scope of the invention. All such modifications are intended to be included within the scope of the claims appended hereto.

What is claimed is:

1. An apparatus for detecting the time of occurrence of a 50% amplitude level in the edges of an input waveform comprising:
    means for receiving said input waveform; and
    means coupled to said receiving means for transforming said input waveform by a transfer function equal to 1-cosine (wt), where w is the angular frequency of the fourier components of said input waveform and t is a predetermined time to obtain an intermediate signal and for comparing said intermediate signal to a reference signal and generating an output signal indicating when the amplitude of said intermediate signal equals the amplitude of said reference signal.

2. The apparatus of claim 1 wherein said means for transforming and comparing comprises:
    an unterminated delay line having an input end coupled to said receiving means and an output end terminated with an impedance that forms an unterminated line condition thereby causing reflection of said input signal back toward said input end, the delay line providing a selected signal transmission delay between the input and output ends;
    means for summing signals present at said input end of said delay line; and
    means for subtracting the signal provided by said summing means from the signal present at said output end of said delay line.

3. The apparatus of claim 2 wherein said means for summing is a resistor and said means for subtracting is a differential amplifier.

4. The apparatus of claim 2 wherein said means for subtracting and said means for comparing is a comparator.

5. The apparatus of claim 1 further comprising:
    a signal separator coupled to said receiving means for generating a transition from one logic state to the other when an edge of a signal in said input waveform passes through a selected amplitude level;
    delay means coupled to said signal separator for generating a transition from one logic level to the other logic level which transition is delayed in time by a predetermined time from the transition generated by said signal separator; and
    means coupled to said delay means for generating a pulse which starts upon occurrence of the transition generated by said signal separator and ends upon occurrence of the transition generated by said delay means, to provide a gating window for gating said output signal.

6. The apparatus of claim 5 further comprising gating means coupled to receive said output signal and said pulse for gating said output signal through to an output during the time of said pulse between said transitions.

7. An apparatus for indicating the time when an edge of an input signal passes a predetermined amplitude comprising:
    an input;
    a summing impedance coupled between said input and an intermediate node;
    delay line having an input coupled to said node and having an output;
    a comparison means having an input coupled to said delay line output and having another input coupled to said node so as to subtract any signal at said node from any signal at the output of said delay line and generate an output signal indicating when said edge of said input signal reaches said predetermined amplitude.

8. An apparatus for detecting the time when an input signal reaches a predetermined amplitude comprising:

first delay means for delaying said input signal a first delay time in travel from an input node to a reference node;

second delay means for delaying said input signal arriving at said reference node a second delay time equal to said first delay time in travel from said reference node to an intermediate node;

first factoring means having an input coupled to said input node and having an output for providing a first intermediate signal which is equal to half the signal amplitude of the signal at said input node;

second factoring means having an input coupled to said intermediate node and having an output for providing a second intermediate signal which is equal to half the signal amplitude of the signal at said input node;

summing means for summing said first and second intermediate signals and presenting the result at an output;

comparing means having a first input coupled to the output of said summing means and a second input coupled to said reference node for generating a signal when the signals at said first and second inputs of said comparing means are equal.

9. The apparatus of claim 8 wherein said input signal is digital and said first and second delay means are digital delay lines and said summing means is a digital adder.

10. The apparatus of claim 9 wherein said first and second factoring means each includes a shift register and control logic to cause a right shift of the digital number representating said input signal to generate said first and second intermediate signals as digital representations of their respective input signals divided by two.

11. The apparatus of claim 8 wherein said input signal is analog and said first and second delay means are analog delay lines having matched delays and matched attenuation factors.

12. The apparatus of claim 11 wherein said factoring means is a pair of matched voltage dividers coupled to divide the amplitude of the signals at said input node and said intermediate node by two.

13. The apparatus of claim 12 wherein said summing means is an operational amplifier coupled as a current to voltage converter and having its current input coupled through two summing resistors to receive said first and second intermediate signals, respectively, and said comparing means is a comparator having one input coupled to said reference node and the other input coupled to the output of said summing means.

14. An apparatus for detecting the time that an input signal reaches a predetermined magnitude comprising:

an input terminal for receiving said input signal;

a low pass filter connected to said input terminal and having an output;

a peak detector means coupled to the output of said low pass filter to detect signal amplitude peaks in said input signal and for presenting a signal equal to the detected peak at an output and having a gain control input;

a slicer means having a reference input coupled to said output of said peak detector, and having a signal input coupled to said input terminal for generating at an output an output signal having at least one positive going edge and at least one negative going edge, each negative going edge indicating a time said input signal passes a certain amplitude in a negative going direction, and each positive going edge indicating a time said input signal passes a certain amplitude in a positive going direction;

a delay means coupled to said output of said slicer means for generating an output signal having an edge corresponding to each said edge in the output signal from said slicer means but delayed in time;

first gating means coupled to said delay means for generating a first pulse beginning upon an occurrence of each negative going edge in the output signal of said slicer and ending upon the occurrence of the corresponding edge in the output signal from said delay means;

second gating means coupled to said delay means for generating a second pulse beginning upon an occurrence of each positive going edge in the output signal of said slicer and ending upon the occurrence of the corresponding edge in the output signal from said delay means;

a noise inverter means having a first input coupled to said input terminal, a second input connected to a reference voltage, and an output terminal coupled to said gain control input of said peak detector means, for detecting each time the amplitude of said input signal exceeds the peak amplitude detected by said peak detector means and for generating an output signal is coupled to said gain control input to lower the gain of said peak detector means;

a summing impedance coupled to said input terminal and having an output node;

a delay line having an input coupled to said output node of said summing impedance and having an output node for imposing a predetermine delay upon a signal travelling in either direction between said input and said output node;

a comparator having inverting and non-inverting inputs and outputs and having two strobe inputs, each strobe input for enabling one of said outputs, one of said inputs coupled to the output of said delay line and the other input coupled to the output node of said summing resistor and said strobe inputs coupled to said first and second pulses generated by said first and second gating means; and an R-S flip flop having its R and S inputs coupled to said outputs of said comparator.

15. An apparatus as defined in claim 14 wherein said peak detector includes a differential amplifier having an inverting input and further comprising means for providing negative feedback to said inverting input of said differential amplifier in said peak detector from the output of said amplifier in said peak detector to prevent the peak detector from having a gain so high as to cause oscillation.

16. An apparatus as defined in claim 15 further comprising a storage capacitor and an emitter follower having an emitter line and a base input and having a voltage divider resistor network as a feedback impedance in the emitter line of said emitter follower, said base input of said emitter follower coupled to said storage capacitor, and wherein one of said inputs of said slicer means is coupled to a predetermined point in said voltage divider network.

17. An apparatus as defined in claim 16 wherein said second input of said noise inverter means is coupled to a predetermined point in said voltage divider network selected to provide a reference voltage which is more negative than the negative peak amplitude of a television horizontal synchronization pulse.

18. An apparatus as defined in claim 14 wherein said peak detector includes a positive voltage input terminal, a storage capacitor, a means for constantly leaking current into said storage capacitor to charge the capacitor to a known voltage in the absence of detected peaks in said input signal and a means for keeping a latching diode in said peak detector between the output of an amplifier in said peak detector and said storage capacitor always reversed biased except when a peak is detected in said input signal.

19. A method of detecting the time an input signal reaches a predetermined amplitude comprising the steps of:
  passing said input signal through an apparatus which has a transfer function equal to 1-cosine (wt) where w is the angular frequency of the fourier series components which make up said input signal and t equals a predetermined time;
  comparing the signal so transformed to a voltage reference level and generating an output signal indicating when the input signal equals said reference level.

20. The method of claim 19 wherein said passing step comprises the steps of:
  sending said input signal through a summing resistor and then through a delay line having an input and having an output which is terminated in a very high impedance, said delay line imposing a predetermined delay on said input signal to create a delayed signal at the output of said delay line and a summed signal at the input of said delay line comprising the sum of said input signal and a reflected signal from said output of said delay line;
  subtracting said delayed signal at the output of said delay line from the summed signal at the input of said delay line.

21. The method of claim 20 wherein said step of subtracting is done by applying said summed signal and said delayed signal to the inverting and non-inverting inputs of a comparator.

22. The method of claim 19 further comprising the steps of:
  detecting peaks in said input signal;
  generating a slice level reference signal from the amplitude of each detected peak;
  comparing said input signal to said slice level reference signal and generating a slice output signal which makes a first transition from one logic level to the other when said input signal passes said slice level reference signal in a first predetermined direction, and which makes a second transition when said input signal passes said slice level reference signal in a second predetermined direction;
  generating a pulse for each of said first and second transitions generated in said step of comparing the input signal to said slice level reference signal, said pulse commencing upon occurrence of its corresponding transition and lasting for a predetermined time;
  enabling said step of comparing the signal transformed by said transfer function to a voltage reference level only during the duration of said pulses.

23. The method of claim 19 further comprising the steps of:
  detecting peaks in said input signal;
  generating a slice level reference signal from the amplitude of each detected peak;
  comparing said input signal to said slice level reference signal and generating a slice output signal which makes a transition from one logic level to the other when said input signal passes said slice level reference signal in a first direction;
  generating a pulse for each said transition generated in said step of comparing said input signal to said slice level, said pulse commencing upon occurrence of its corresponding transition and lasting for a predetermined time;
  enabling said step of comparing the input signal transformed by said transfer function to a voltage reference level only during the duration of said pulses.

* * * * *

UNITED STATES PATENT AND TRADEMARK OFFICE
CERTIFICATE OF CORRECTION

PATENT NO. : 4,677,388
DATED : June 30, 1987
INVENTOR(S) : Eric F. Morrison

It is certified that error appears in the above-identified patent and that said Letters Patent is hereby corrected as shown below:

Column 6, line 11, "syn" should read --sync--;

Column 6, line 55, "errors" should read --error--;

Column 6, line 58, "as" should read --are--.

Signed and Sealed this

First Day of March, 1988

Attest:

DONALD J. QUIGG

*Attesting Officer*    *Commissioner of Patents and Trademarks*